United States Patent [19]

Ueno et al.

[11] Patent Number: 5,500,395
[45] Date of Patent: Mar. 19, 1996

[54] METHOD FOR MANUFACTURING AN ALUMINUM NITRIDE SINTERED BODY

[75] Inventors: Fumio Ueno, Yokohama; Mitsuo Kasori, Kawasaki; Akihiro Horiguchi, Fujisawa; Katsuyoshi Oh-Ishi, Kawasaki, all of Japan

[73] Assignee: Kabushiki Kaisha Toshiba, Kawasaki, Japan

[21] Appl. No.: 320,758

[22] Filed: Oct. 11, 1994

Related U.S. Application Data

[62] Division of Ser. No. 153,970, Nov. 18, 1993, Pat. No. 5,409,869.

[30] Foreign Application Priority Data

| Nov. 18, 1992 | [JP] | Japan | 4-308664 |
| Nov. 18, 1992 | [JP] | Japan | 4-308665 |
| Nov. 18, 1992 | [JP] | Japan | 4-309023 |
| Nov. 18, 1992 | [JP] | Japan | 4-309024 |
| Mar. 12, 1993 | [JP] | Japan | 5-051708 |

[51] Int. Cl.$^6$ .............................................. C04B 35/581
[52] U.S. Cl. ................................................ 501/98
[58] Field of Search ......................... 501/96, 98; 264/65

[56] References Cited

U.S. PATENT DOCUMENTS

| 4,698,320 | 10/1987 | Kasori et al. | 501/96 |
| 4,719,187 | 1/1988 | Bardham et al. | 501/97 |
| 4,952,535 | 8/1990 | Merkel | 501/96 |

*Primary Examiner*—Karl Group
*Attorney, Agent, or Firm*—Oblon, Spivak, McClelland, Maier & Neustadt

[57] ABSTRACT

Disclosed is an aluminum nitride sintered body which has a high thermal conductivity and a high strength and which can be manufactured through low-temperature, short-time sintering. This aluminum nitride sintered body has an average grain size of aluminum nitride grains of 2 μm or less, a thermal conductivity of 80 W/m.K or more, and a relative density of 98% or more.

12 Claims, 2 Drawing Sheets

METHOD FOR MANUFACTURING AN ALUMINUM NITRIDE SINTERED BODY

This is a Division of application Ser. No. 08/153,970 filed on Nov. 18, 1993 now U.S. Pat. No. 5,409,869.

BACKGROUND OF THE INVENTION

1. Field of the Invention

The present invention relates to an aluminum nitride (AlN) sintered body, a method for manufacturing the same, and a ceramic circuit board including the sintered body as an insulating layer.

2. Description of the Related Art

An aluminum nitride (AlN) sintered body is used as a radiating circuit board for mounting semiconductors since its thermal conductivity is higher than that of alumina or the like and its thermal expansion coefficient is close to that of silicon (Si). The AlN sintered body also has excellent characteristics, such as a high strength at high temperatures and a low reactivity with molten metals. Therefore, the sintered body is beginning to be applied to various other fields. Recently, as researches for increasing the thermal conductivity of the AlN sintered body have advanced, 200-W/m.K class sintered bodies and packages have been able to be obtained in many places.

To achieve a high thermal conductivity in the AlN sintered body, it is considered necessary to decrease the heterophase amount in grain boundaries for the purpose of decreasing phonon scattering in the grain boundaries, thereby increasing the grain size. For this purpose, it has been assumed necessary to sinter an AlN powder at a high temperature around 1,800° C. for a long time period to thereby grow grains of the sintered body to have a grain size of several μm to between 10 and 20 μm. However, the growth of crystal grains accompanies a problem of a decrease in mechanical strength. This decrease in the mechanical strength of the AlN sintered body is a serious problem in applying the sintered body to a circuit board or a package for mounting semiconductor chips.

A high thermal conductivity of the AlN sintered body is achieved by adding a sintering agent, such as an alkaline earth metal compound or a rare earth element compound, which traps impurity oxygen of AlN crystal grains, and sintering the resultant material at a high temperature. However, the AlN sintered body whose thermal conductivity is raised by such a method is poor in mechanical characteristics. A circuit board for mounting semiconductor chips must have an enough strength to withstand a thermal stress or other mechanical stresses, as well as a high thermal conductivity. For this reason, the advent of an AlN sintered body having both a high thermal conductivity and a high strength has been desired strongly. Since, however, a high thermal conductivity and a high strength are contradictory characteristics from a conventional commonsense point of view, almost no AlN sintered bodies having both the characteristics have been reported.

The mechanism of sintering and the relationship between the thermal conductivity and the strength of the AlN sintered body will be described in detail below. Generally, an aluminum oxide impurity unavoidably contained in an AlN powder reacts with a sintering agent, such as a rare earth element compound, to produce aluminates during sintering. These aluminates produce a liquid phase during the sintering, remaining in the edges and the triple points of AlN grain boundaries. In other words, the aluminum oxide impurity is trapped in a grain boundary phase, and the purity of the AlN crystal itself increases. As an example, the use of $Y_2O_3$ as a sintering agent produces a Y-Al-O-based composite oxide, such as $3Y_2O_3.5Al_2O_3$ or $Y_2O_3.Al_2O_3$, and the use of CaO as a sintering agent forms a Ca—Al—O-based composite oxide, such as $CaO.Al_2O_3$ or $2CaO.Al_2O_3$. It is assumed that liquid phase sintering of AlN progresses to increase its density because of the presence of such a composite oxide grain boundary phase. As can be predicted from the eutectic points of the above individual composite oxides, the sintering temperature for obtaining the AlN sintered body is approximately 1,800° C. when the rare earth-based sintering agent is used. Although the sintering temperature when the alkaline earth metal-based sintering agent is used is slightly lower than that when the rare earth-based sintering agent is used, there is no large difference between the two temperatures.

When a long-time sintering in a reducing atmosphere at a temperature of 1,800° C. or more is combined with the addition of the above sintering agent, the thermal conductivity further increases to make the manufacture of an AlN sintered body of about 270 W/m.K possible. This is so because a grain boundary phase composition changes during the high-temperature, long-time sintering, reducing solid solution oxygen contained in AlN grains. Since, however, the high-temperature, long-time sintering also causes growth of crystal grains simultaneously, the mechanical strength decreases from 40 to 50 kg/mm² to 30 kg/mm². As described above, a high thermal conductivity and a high strength are contradictory characteristics in the AlN sintered body, so it has been very difficult to improve both the characteristics at the same time.

As for applications of the AlN sintered body, on the other hand, techniques to form the sintered body into various parts and to mass-produce the sintered body have been studied in recent years. In particular, decreasing the manufacturing cost is an urgent necessity to widen the range of applications of the AlN sintered body, and so a demand has arisen for sintering at a low temperature of 1,700° C. or less. In such low-temperature sintering, however, it has been impossible to obtain an AlN sintered body having both a high thermal conductivity and a high strength.

SUMMARY OF THE INVENTION

It is an object of the present invention to provide an aluminum nitride (AlN) sintered body which has a high thermal conductivity and a high strength and which can be manufactured by performing low-temperature, short-time sintering.

It is another object of the present invention to provide a method for manufacturing an AlN sintered body with a high thermal conductivity and a high strength by sintering at a low temperature for a short time period.

It is still another object of the present invention to provide a circuit board including an insulating layer with a high thermal conductivity and a high strength.

According to the present invention, there is provided an aluminum nitride sintered body having an average grain size of aluminum nitride grains of 2 μm or less, a thermal conductivity of 80 W/m.K or more, and a relative density of 98% or more.

In addition, according to the present invention, there is provided a method for manufacturing an aluminum nitride sintered body, comprising the steps of:

adding a halogen-containing rare earth element compound, as a sintering agent, to an aluminum nitride powder with an average primary grain size of 0.05 to 1.5 μm and an impurity oxygen amount of 0.1 to 2.5 wt %, and molding the resultant material to form a molded body; and sintering the molded body in a non-oxidizing atmosphere at 1,000° to 1,700° C.

Furthermore, according to the present invention, there is provided a ceramic circuit board comprising:

an insulating layer consisting of an aluminum nitride sintered body with an average grain size of aluminum nitride grains of 2 μm or less, a thermal conductivity of 80 W/m·K or more, and a relative density of 98% or more; and a conductor layer formed on the insulating layer and containing, as a main constituent, one element selected from the group consisting of platinum, palladium, nickel, tungsten, and molybdenum.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
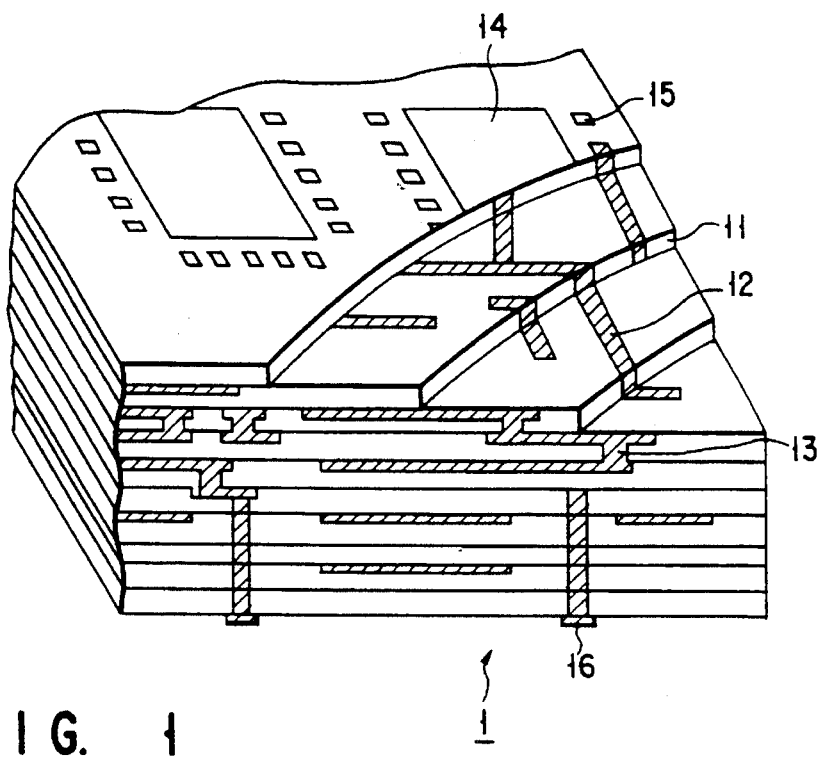
FIG. 1 is a sectional view showing the structure of a multilayered wiring ceramic circuit board of one embodiment according to the present invention.

An aluminum nitride (AlN) sintered body according to the present invention has an average grain size of AlN grains of 2 μm or less, a thermal conductivity of 80 W/m·K or more, and a relative density of 98% or more.

Such an AlN sintered body according to the present invention has a very high thermal conductivity and also exhibits a high strength since it has a dense structure with a relative density of 98%. In addition, since the average grain size of the AlN grains of this AlN sintered body is 2 μm or less, the strength of the AlN sintered body further increases, and its surface smoothness becomes very high. Therefore, the AlN sintered body according to the present invention is suitable as particularly an insulating layer of a circuit board or the like on which a fine conductor layer is formed.

The AlN sintered body according to the present invention is preferably manufactured by methods (1) and (2) explained below.

AlN Sintered Body Manufacturing Method (1)

First, a sintering agent is added to an AlN powder with an average primary grain size of 0.01 to 0.3 μm and an impurity oxygen amount of 1.5 wt % (exclusive) to 7 wt % (inclusive), and the resultant material is mixed by using a ball mill or the like. Kneading and granulation are performed to prepare a raw material while adding a binder if necessary, and the raw material is molded to form a molded body.

The average primary grain size of the AlN powder is limited to the above range for the reasons explained below. That is, if the average primary grain size of the AlN powder is less than 0.01 μm, not only handling of the material may become difficult but also the shrinkage ratio during sintering of the molded body may increase. If, on the other hand, the average primary grain size of the AlN powder exceeds 0.3 μm, it may become difficult to perform low-temperature sintering at 1,700° C. or less, particularly 1,550° C. or less. The average primary grain size of the AlN powder more preferably ranges between 0.03 and 0.15 μm.

The impurity oxygen amount of the AlN powder means an amount which is obtained immediately before sintering and which will effectively take part in sintering. The impurity oxygen amount of the AlN powder is limited to the above range for the reasons explained below. That is, if the impurity oxygen amount is 1.5 wt % or less, low-temperature sintering at 1,700° C. or less, particularly 1,550° C. may become difficult to perform. On the other hand, if the impurity oxygen amount exceeds 7 wt %, it may become difficult to obtain an AlN sintered body with a high thermal conductivity. The impurity oxygen amount more preferably ranges from 2 to 6 wt %.

Usable examples of the sintering agent are alkaline earth metal compounds such as oxides, carbides, fluorides, carbonates, oxalates, nitrates, and alkoxides of alkaline earth metals such as Ca, Ba, and Sr, and/or rare earth element compounds such as oxides, carbides, fluorides, carbonates, oxalates, nitrates, and alkoxides of rare earth elements such as Y, La, and Ce.

The mixing amount of the alkaline earth metal compound and/or the rare earth element compound as the sintering agent preferably ranges between 0.5 to 10 parts by weight, as the amount of an alkaline earth metal element and/or a rare earth element, with respect to 100 parts by weight of the AlN powder.

The material consisting of the AlN powder and the sintering agent described above may contain an AlN powder with an average grain size larger than the average grain size defined above. The material may also contain, in addition to the AlN powder and the sintering agent, oxides, carbides, fluorides, carbonates, oxalates, and nitrates of transition metals such as Ti, W, Mo, Ta, and Nb in an amount of 0.05 to 1 wt %, as an amount of the transition metal, with respect to the AlN powder, in order to perform coloring or increase the strength if necessary. Furthermore, to lower the sintering temperature, the material may contain an aluminum compound, such as aluminum oxide or aluminum fluoride, or a silicon compound, such as silicon oxide or silicon nitride, in an amount of 1 wt % or less with respect to the AlN powder.

As the molding method, mold press, hydrostatic press, or sheet forming can be adopted.

Subsequently, the molded body is heated in a non-oxidizing atmosphere such as a nitrogen gas flow to remove the binder and sintered in a non-oxidizing atmosphere at 1,000° to 1,700° C., preferably 1,300° to 1,600° C., and more preferably 1,300° to 1,550° C., thereby manufacturing an AlN sintered body.

It is desirable that the above sintering step be performed in a nitrogen gas atmosphere with the molded body contained in a vessel (sintering vessel) which consists of AlN or graphite. The sintering time is preferably 10 minutes (inclusive) to 90 hours (inclusive).

According to this method, it is possible to manufacture an AlN sintered body with an average AlN grain size of 2 μm or less, a high thermal conductivity of 80 W/m-K or more, and an improved strength resulting from fine AlN grains, through the low-temperature sintering at 1,700° C. or less, preferably 1,550° C. or less. AlN Sintered Body Manufacturing Method (2)

First, a sintering agent is added to an AlN powder mixture consisting of 10 to 70 parts by weight of an AlN powder with an average primary grain size of 0.01 to 0.3 μm and 30 to 90 parts by weight of an AlN powder with an average primary grain size of 0.5 to 1.0 μm. The resultant material is mixed by using a ball mill to prepare a material powder, and the material powder is then molded to form a molded body.

When the sintering properties and thermal conductivity are taken into account, the impurity oxygen amount of the AlN powder is preferably 8 wt % or less, and more preferably 0.4 to 6 wt %.

The mixing ratio of the AlN powder with an average primary grain size of 0.01 to 0.3 μm contained in the above AlN powder mixture is limited for the reasons explained below. That is, if the mixing ratio of the above predetermined AlN powder is less than 10 parts by weight, sintering at a low temperature of 1,700° C. or less may become difficult to perform. If, on the other hand, the mixing ratio of the above predetermined AlN powder exceeds 70 parts by weight, the shrinkage ratio during sintering may increase.

The type and the mixing amount of the sintering agent can be similar to those explained in the manufacturing method (1). In addition, like in the manufacturing method (1), the material powder consisting of the AlN powder and the sintering agent is, if necessary, allowed to contain oxides, carbides, fluorides, carbonates, oxalates, and nitrates of various transition metals for the purpose of performing coloring and increasing the strength, or various aluminum compounds, silicon compounds, and silicon for the purpose of decreasing the sintering temperature, in respective predetermined amounts.

The material powder is preferably prepared by adding a binder and performing kneading and granulation.

Examples of the molding method are mold press, hydrostatic press, and sheet forming.

Subsequently, the molded body is heated in a nonoxidizing atmosphere, e.g., in a nitrogen gas flow to remove the binder, and sintered in a non-oxidizing atmosphere at 1,000° to 1,700° C., preferably 1,300° to 1,600° C., and more preferably 1,300° to 1,550° C., thereby manufacturing an AlN sintered body.

It is desirable that the sintering step be performed in a nitrogen gas atmosphere with the molded body contained in a vessel (sintering vessel) consisting of AlN, graphite, or BN. The sintering time is preferably 10 minutes (inclusive) to 100 hours (inclusive).

This method also can manufacture an AlN sintered body with an average AlN grain size of 2 μm or less, a high thermal conductivity of 80 W/m.K or more, and an improved strength derived from fine AlN grains, through the low-temperature sintering. In particular, since this method uses an AlN powder mixture consisting of 10 to 70 parts by weight of an AlN powder with an average primary grain size of 0.01 to 0.3 μm and 30 to 90 parts by weight of an AlN powder with an average primary grain size of 0.5 to 1.0 μm, the packing properties can be improved significantly when the AlN powder mixture is molded after being added with the sintering agent. Consequently, the shrinkage ratio in the sintering step can be controlled, and the use of the fine AlN powder with an average primary grain size of 0.01 to 0.3 μm makes it possible to set the sintering temperature at a low temperature of 1,700° C. or less. In addition, the AlN powder mixture containing the AlN powder with an average primary grain size of 0.5 to 1.0 μm in addition to the fine AlN powder is improved significantly in handling properties as compared with an AlN powder consisting of only a very fine powder of AlN, and this can improve working properties.

The AlN sintered body according to the present invention preferably has an average grain size, a thermal conductivity, and a relative density falling within the above respective ranges and at the same time contains a halogen in its grain boundary phase. More specifically, it is preferable that the AlN sintered body contain both LnOX and $Ln_xAl_yO_{2/3(x+y)}$ (wherein Ln represents a rare earth element and X represents a halogen element) in the grain boundary phase. The halogen element content of the grain boundary phase is preferably 0.01% to 1%.

The AlN sintered body having the grain boundary phase containing halogen can be manufactured by low-temperature sintering because the melting point of the grain boundary phase is lowered. Consequently, AlN grains are reduced in size to have a uniform grain size, and this improves the mechanical strength. The AlN sintered body which satisfies the above conditions of the average grain size, the thermal conductivity, and the relative density and which contains a halogen element in its grain boundary phase can be manufactured by the following methods.

(a) The AlN sintered body is manufactured by sintering a molded body consisting of an AlN powder and a halogen-containing rare earth element compound (sintering agent) in an inert atmosphere at 1,000° to 1,700° C., preferably 1,300° to 1,600° C., and most preferably 1,300° to 1,550° C.

(b) The AlN sintered body is manufactured by sintering a molded body consisting of an AlN powder, an alkaline earth metal compound and/or a rare earth element compound (sintering agent), and a halogen or a halogen compound (solid compound) in an inert atmosphere at 1,000° to 1,700° C., preferably 1,300° to 1,600° C., and most preferably 1,300° to 1,550° C.

(c) The AlN sintered body is manufactured by sintering an AlN powder and an alkaline earth metal compound and/or a rare earth element compound in an inert gas atmosphere containing a halogen gas or a halogen compound gas at 1,000° to 1,700° C., preferably 1,300° to 1,600° C., and most preferably 1,300° to 1,550° C.

The molded bodies used in the methods (a) to (c) above are manufactured by mixing constituent components of their respective material powders by using a ball mill or the like, kneading and granulating the resultant mixtures to prepare material powders while adding a binder as needed, and molding the material powders.

The AlN powder constituting each molded body has an average primary grain size of preferably 0.05 to 1.5 μm, and more preferably 0.1 to 1.2 μm, and an impurity oxygen amount of preferably 0.1 to 2.5 wt %, and more preferably 0.3 to 2.0 wt %. If the average primary grain size of the AlN powder is less than 0.05 μm, molding may become difficult to perform. If the average primary grain size of the AlN powder exceeds 1.5 μm, the sintering properties of AlN may be degraded. If the impurity oxygen amount is less than 0.1 wt %, the properties of AlN may change during molding. If the impurity oxygen amount exceeds 2.5 wt %, the final thermal conductivity may decrease.

Usable examples of the halogen-containing rare earth element compound mixed in the molded body in the method (a) are rare earth element halides such as $YF_3$ and $TbCl$, rare earth element acid halides such as YOF and $LaO_xI_{1-x}$, and chalcogen halides.

As the alkaline earth metal compound and/or the rare earth element compound mixed in the molded bodies in the methods (b) and (c), it is possible to use the compounds enumerated above as the sintering agent in the AlN sintered body manufacturing methods described above. When the rare earth element compounds were used as the sintering agent, it was confirmed that the same effect was obtained by compounds of Y, La, Ce, and Lu, except for that of Pm.

Assuming that the amount (the amount of an element) of the halogen-containing rare earth element compound, the alkaline earth metal compound, or the rare earth element compound mixed in each of the above molded bodies is (A) and the amount of the AlN powder is (B), A/(A+B) is preferably less than 0.3, and more preferably 0.001 to 0.2. In the molded body used in the method (b), the amount of the halogen element contained in the molded body preferably ranges from 0.05 to 10 wt % as the amount of the element.

As the molding method, mold press, hydrostatic press, or sheet forming can be adopted.

Sintering of each molded body need not be performed in a reducing atmosphere, but it is possible to use, e.g., a heating element, an oven member, and a box member consisting of carbon-based materials, various ceramic materials, and metal materials.

Examples of the atmosphere for sintering the molded bodies are inert gases such as nitrogen gas, a rare gas, and carbonic acid gas and a gas containing a halogen or carbon monoxide. Especially in the case of the molded body used in the method (c), it is required to introduce the gas of a halogen element or a halogen compound as described above.

The gas phase pressure during the sintering of the molded bodies is preferably 0.01 to a value less than 1 atm, and more preferably 0.1 atm to 0.8 atm. If the vapor phase pressure is less than 0.01 atm particularly in the method (a) or (b), the halogen evaporates hard from the molded body, the surface of the resultant AlN sintered body may be roughened. On the other hand, if the vapor phase pressure is 1 atm or more, excess halogen remains in the molded body to result in unsatisfactory sintering properties. If, however, the sintering temperature is 1,550° C. or less, the vapor phase pressure can take any given value.

The sintering time of the molded bodies is preferably at least 10 minutes or more. If the sintering time is less than 10 minutes, it may become difficult to obtain a sufficiently densified AlN sintered body. If sintering is performed for 72 hours or more at a sintering temperature of 1,550° C. or more, AlN grains may grow excessively to decrease the strength of the sintered body.

It is preferable that the sintering step in the method (a) be performed under conditions in which the molar ratio of a rare earth element to oxygen is 1 or less.

A ceramic circuit board according to the present invention comprises a ceramic insulating layer consisting of an AlN sintered body with an average grain size of aluminum nitride grains of 2 µm or less, a thermal conductivity of 80 W/m.K or more, and a relative density of 98% or more, and a conductor layer formed on the insulating layer and containing, as a main constituent, one element selected from the group consisting of platinum (Pt), palladium (Pd), nickel (Ni), tungsten (W), and molybdenum (Mo).

The ceramic circuit board according to the present invention has a remarkable performance derived from the characteristics of the AlN sintered body that constitutes the ceramic insulating layer. That is, this insulating layer has a high thermal diffusivity (thermal conductivity), a high strength, and a high heat resistance. In addition, the conductor layer does not peel from the insulating layer and is free from defects such as oxidation and disconnection. This makes it possible to realize a ceramic circuit board which exhibits a high circuit performance.

The ceramic circuit board according to the present invention is manufactured by properly selecting conditions and materials used in accordance with the type of a conductor metal as will be described below.

(1st Step)

A sintering agent is added to an AlN powder, and the resultant powder is mixed well. This material powder is further added with a binder, and the resultant material is kneaded and dispersed in a predetermined solvent. After the viscosity of the material is controlled to a predetermined value, granulation and grain dressing are performed to prepare a slurry. Subsequently, the slurry is sheeted by, e.g., a doctor blade process and dried at a temperature of about 200° C., thereby forming a green sheet.

Like in the AlN sintered body manufacturing method (1) mentioned earlier, it is preferable that the above AlN powder be an AlN powder with an average primary grain size of 0.01 to 0.3 µm and an impurity oxygen amount of more than about 1.5 wt % to less than 7 wt %.

If the average primary grain size of the AlN powder is less than 0.01 µm, there is a possibility that not only handling of the AlN powder becomes difficult but also the shrinkage ratio increases when the green sheet is sintered. If, on the other hand, the average primary grain size of the AlN powder exceeds 0.3 µm, it may become difficult to perform low-temperature sintering at 1,700° C. or less, preferably 1,600° C. or less, and most preferably 1,550° C. or less. The average primary grain size of the AlN powder is more preferably 0.03 to 0.15 µm.

If the impurity oxygen amount of the AlN powder is 1.5 wt % or less, low-temperature sintering at 1,700° C. or less, preferably 1,600° C. or less, and most preferably 1,550° C. or less may become difficult to perform. On the other hand, if the impurity oxygen amount of the AlN powder exceeds 7 wt %, it becomes difficult to obtain an AlN sintered body, i.e., a ceramic insulating layer with a high thermal conductivity. The impurity oxygen amount of the AlN powder is most preferably 2 to 6 wt %.

As the AlN powder, it is also possible to use an AlN powder mixture consisting of 10 to 70 parts by weight of an AlN powder with an average primary grain size of 0.01 to 0.3 µm and 30 to 90 parts by weight of an AlN powder with an average primary grain size of 0.5 to 1.0 µm, as in the AlN sintered body manufacturing method (2) described above. The use of this AlN powder mixture can significantly improve packing properties when the AlN powder mixture is molded by adding a sintering agent. Consequently, the shrinkage ratio in the sintering step (to be described later), can be controlled. In addition, the use of the AlN powder with an average primary grain size of 0.01 to 0.3 µm makes it possible to set the sintering temperature at a low temperature of 1,600° C. or less. Furthermore, the AlN powder mixture containing the AlN powder with an average primary grain size of 0.5 to 1.0 µm in addition to the fine AlN powder is improved significantly in handling properties as compared with an AlN powder consisting of only a very fine powder of AlN, and this can improve working properties.

When the sintering properties and thermal conductivity are taken into consideration, the impurity oxygen amount of the AlN powder used as the powder mixture is preferably 8 wt % or less, and more preferably 0.4 to 6 wt %.

As the sintering agent, an alkaline earth metal compound and/or a rare earth element compound similar to those used in the AlN sintered body manufacturing method (1) described above can be used.

The mixing amount of the sintering agent preferably ranges between 0.5 and 10 wt % with respect to the material powder. If the mixing amount of the sintering agent is less than 0.5 wt %, an unsatisfactory thermal conductivity may result. If, on the other hand, the mixing amount of the sintering agent exceeds 10 wt %, there is a possibility that the resultant AlN sintered body, i.e., the ceramic insulating layer is prevented from being densified, leading to a decrease in the thermal conductivity. The mixing amount of the sintering agent most preferably ranges from 3 to 7 wt %.

Examples of the binder are an acrylic binder and a PVB-based binder.

Examples of the solvent are an alcoholic solvent such as n-butanol, methylisobutyl, and toluene.

As in the AlN sintered body manufacturing method (1), the slurry may contain, in addition to the AlN powder and the sintering agent, oxides, carbides, fluorides, carbonates, oxalates, and nitrates of transition metals such as Ti, W, Mo, Ta, and Nb in an mount of 1 wt % or less, as an amount of the transition metal, with respect to the AlN powder, in order to perform coloring and increase the strength as needed. In addition, in order to decrease the sintering temperature, the slurry may also contain aluminum compounds, such as aluminum oxide and aluminum fluoride, silicon compounds, such as silicon oxide and silicon nitride, or silicon, in an amount of about 1 part by weight or less with respect to 100 parts by weight of the AlN powder.

(2nd Step)

A conductor paste prepared by adding a binder and a solvent to a metal powder of Pt, Pd, Ni, W, or Mo and kneading the resultant mixture is coated on at least one surface of the AlN green sheet obtained in the above first step by using a screen printing process or the like, thereby forming a desired conductor paste pattern.

As the binder contained in the conductor paste, a cellulose-based binder or an acrylic binder is used. Examples of the solvent are terepneol, toluene, and ethanol.

The conductor paste may contain, as a filler, the AlN powder used in the first step, a powder of an alkaline earth metal compound and/or a rare earth element compound as a sintering agent, or a powder mixture of the AlN powder and a sintering agent. The use of this conductor paste makes it possible to match the shrinkage ratios of the AlN green sheet and the conductor paste pattern with each other during sintering performed in the third step (to be described later). The above filler consisting of the AlN powder is mixed at a ratio of preferably 0.01 to 70 vol %, and more preferably 0.1 to 50 vol % with respect to the total amount of the metal powder and the filler contained in the conductor paste. The filler consisting of the sintering agent is mixed at a ratio of 0.1 to 10 vol % with respect to the total amount of the metal powder and the filler contained in the conductor paste.

For the purpose of further improving the low-temperature sintering properties of AlN, the conductor paste may contain a small amount of $Al_2O_3$ or $WO_3$.

(3rd Step)

The green sheet on which the conductive paste pattern is formed is heated in a non-oxidizing atmosphere, e.g., in a nitrogen gas flow to remove the binder, and sintered in a non-oxidizing atmosphere at a temperature of 1,000° to 1,700° C., preferably 1,300° to 1,600° C. Subsequently, grinding, polishing, formation of thin film circuits, plating, and pin formation are performed on the surface as needed, manufacturing a ceramic circuit board in which a conductor layer which serves as signal lines and power lines and contains Pt, Pd, Ni, W, or Mo as its main constituent is formed on the surface of the ceramic insulating layer consisting of the AlN sintered body.

According to the above method, the green sheet from which the binder is removed, and the conductive paste pattern are sintered at the same time at a low temperature of 1,700° C. or less. This makes it possible to manufacture a high-performance ceramic circuit board including the ceramic insulating layer consisting of the AlN sintered body which has an average AlN grain size of 2 μm or less and a high thermal conductivity of 80 W/m.K or more and which is improved in strength due to a decrease in the size of AlN grains.

In particular, the use of the fine AlN powder with an average primary grain size of 0.01 to 0.3 μm makes sintering at a low temperature (1,700° C. or less) for a short time period possible, reducing the manufacturing cost. In addition, low-melting metals such as Pt, Pd, and Ni can be applied extensively as the conductor metal as well as high-melting metals such as w and Mo.

A ceramic circuit board with a multilayered wiring structure can also be formed in accordance with the above method.

That is, AlN green sheets are formed according to the first step described above, and a plurality of via holes for connecting layers are formed at predetermined positions of each green sheet. As a method for forming the via holes, it is possible to use, e.g., a mechanical method using a punch, a die, or a punching machine, or a laser processing method. Subsequently, in accordance with the above second step, predetermined patterns of a conductor paste are printed on the individual AlN green sheets and filled into the via holes, and these green sheets are stacked to one another such that the positions of the via holes formed in the green sheets are aligned properly, and were hot-pressed. The resultant stacked structure is then sintered at a temperature of 1,700° C. or less in accordance with the third step, manufacturing a ceramic circuit board with a multilayered wiring structure in which the individual conductor layers are electrically connected through the via holes.

In the manufacture of such multilayered ceramic circuit boards, the addition of an AlN powder, a powder of a sintering agent, or a powder mixture of an AlN powder and a sintering agent, as a filler, to the conductor paste can increase the adhesion properties between the conductor layers and the ceramic insulating layers particularly in the via holes, and this prevents occurrence of cracks.

In the ceramic circuit board according to the present invention, the AlN sintered body constituting the ceramic insulating layer preferably has a predetermined average AlN grain size, a predetermined thermal conductivity, and a predetermined relative density and at the same time contains a halogen in its grain boundary phase, like the AlN sintered body as has been described above. The AlN sintered body most preferably contains $Ln_xOX$ and $Ln_xAl_yO_{2/3(x+y)}$ (wherein Ln represents a rare earth element and x represents a halogen element) in the grain boundary phase. The halogen element content in the grain boundary phase is preferably 0.01% (inclusive) to 1% (inclusive).

The AlN sintered body constituting the insulating layer of the above ceramic circuit board can be obtained through low-temperature sintering because the melting point of the grain boundary phase of the AlN sintered body is lowered. As a result, the grain sizes of the AlN grains are reduced to become a uniform grain size. This realizes a ceramic circuit board including an insulating layer consisting of an AlN sintered body with an improved mechanical strength.

The above ceramic circuit board is manufactured by introducing a halogen to AlN in a given step of the AlN sintered body manufacturing method mentioned earlier.

For example, in the first step, a material powder is prepared by using a halogen-containing rare earth element compound as a sintering agent, or by adding a halogen or a halogen compound to a sintering agent consisting of an AlN powder, an alkaline earth metal compound and/or a rare earth element compound. Subsequently, a green sheet is formed from a slurry consisting of the material powder, and, in the third step, sintered in an inert atmosphere at 1,000° to 1,700° C., preferably 1,300° to 1,600° C., and most preferably 1,300° to 1,550° C. The result is a ceramic circuit board having an insulating layer containing a halogen as described above. This ceramic circuit board can also be manufactured by performing sintering in the presence of a halogen gas or a halogen compound gas in an inert atmosphere at 1,000° to 1,700° C., preferably 1,300° to 1,600° C., and most preferably 1,300° to 1,550° C.

The AlN powder contained in the material powder has an average primary grain size of preferably 0.05 to 1.5 µm, and more preferably 0.1 to 1.2 µm and an impurity oxygen amount of preferably 0.1 to 2.5 wt %, and more preferably 0.3 to 2.0 wt %. If the average primary grain size of the AlN powder is less than 0.05 µm, the formation of the green sheet may become difficult to perform. If the average primary grain size of the AlN powder exceeds 1.5 µm, the sintering properties of the AlN green sheet may deteriorate. If the impurity oxygen amount is less than 0.1 wt %, the properties of AlN may change during the molding of the green sheet. If the impurity oxygen amount exceeds 2.5 wt %, the final thermal conductivity may decrease.

In the technique to introduce a halogen to the insulating layer consisting of the AlN sintered body, the above-mentioned method of manufacturing the AlN sintered body containing a halogen in the grain boundary phase is applied for factors other than the AlN powder, e.g., the type of a halogen-containing rare earth element compound to be used as a sintering agent, the amount of a halogen element to be introduced, and the gas phase during sintering.

The ceramic circuit board according to the present invention may include an insulating layer consisting of an AlN sintered body containing a halogen in an AlN grain boundary, and a conductor layer containing a halogen compound. Since the insulating layer and the conductor layer are bonded with a high strength, a ceramic circuit board with a higher performance is realized. As the conductor metal constituting the conductor layer, W or Mo is particularly suitable.

The ceramic circuit board including the above particular insulating layer and conductor layer is manufactured as follows.

That is, in the formation of the ceramic insulating layer in the first step, a powder mixture added with a fluoride of a rare earth element or a fluoride of an alkaline earth metal as a sintering agent is used. In the formation of the conductor layer in the second step, a conductor paste prepared by adding a powder of a fluoride of an alkaline earth metal and/or a fluoride of a rare earth element to a w powder with an average grain size of 0.1 to 1.0 µm or an Mo powder with an average grain size of 0.1 to 5.0 µm is used.

Examples of the fluoride of a rare earth element used in the formation of the insulating layer (first step) and the formation of the conductor layer (second step) are preferably $YF_3$, $ScF_3$, and fluorides of lanthanoid series elements, and most preferably $YF_3$, YOF, $LaF_3$, LaOF, $CeF_3$, and CeOF. Examples of the fluoride of an alkaline earth metal are preferably $CaF_2$, $SrF_2$, and $BaF_2$, and most preferably $CaF_2$. It is desirable that the same fluoride be mixed in the insulating layer and the conductor layer.

In the formation of the conductor layer, the average grain size of the W powder or the Mo powder is limited to the particular range for the reasons explained below. If the average grain size is smaller than the lower limit of the above range, the powder becomes difficult to handle, and this may make pasting of the powder difficult to result in imperfect printing. If the average grain size exceeds the upper limit of the above range, there is a possibility that the shrinkage ratio of the conductor layer becomes excessively small to be unable to match the shrinkage ratio of the AlN insulating layer, producing defects, such as cracks or warpage, in the circuit board finally obtained.

In the manufacture of the ceramic circuit board using the powder mixture and the conductor paste as described above, a powder of a sintering agent for AlN, such as a fluoride of a rare earth element and/or fluoride of an alkaline earth metal, which has a low melting point and a high reactivity is added to the conductor paste containing W or Mo as its main constituent. Therefore, low-temperature sintering at a temperature of 1,700° C. or less, preferably 1,600° C. or less can be performed.

More specifically, since the above fluoride exists continuously, i.e., fluorine atoms are distributed uniformly in both the AlN insulating layer and the conductor layer during the low-temperature sintering, the adhesion between the two layers is improved to match the shrinkage ratios of the two layers. This consequently improves the strength in the interface between the insulating layer consisting of the AlN sintered body and the conductor layer in the ceramic circuit board obtained after the sintering, preventing peeling and disconnection of the conductor layer. This also suppresses occurrence of cracks in the insulating layer and occurrence of warpage of the circuit board.

Especially when the AlN powder is added together with the fluoride powder to the conductor paste, the shrinkage behavior of the insulating layer consisting of the AlN sintered body and that of the conductor layer become closer to each other during sintering, and this further suppresses occurrence of cracks and the like.

In addition, although a detailed mechanism is still unknown, since the fluoride-based sintering agent is used, fluorine atoms constituting the fluoride mixed during the preparation of the conductor paste remain in the AlN insulating layer and the conductor layer of the ceramic circuit board obtained after sintering, as compared with a case in which a general oxide-based sintering agent such as $Y_2O_3$ is used. For example, when $YF_3$ is mixed during the preparation of the conductor paste, it is assumed that it remains in the form of YOF. Because of the presence of these fluorine atoms, textures of F which is contained in W or Mo of the conductor layer and F which is contained in AlN continue even in the circuit board obtained after sintering, forming a conductor layer with a high interface strength (adhesion strength). This greatly improves the performance of the circuit board.

According to the present invention, there is provided a ceramic circuit board particularly defined below by the use of a fluoride of a rare earth element or a fluoride of an alkaline earth metal in the formation of the insulating layer, and the use of a paste prepared by adding a powder of a fluoride of an alkaline earth metal and/or a fluoride of a rare earth metal to a W powder or an Mo powder with a predetermined average grain size in the formation of the conductor layer.

That is, there is provided a ceramic circuit board comprising a ceramic insulating layer consisting of an AlN sintered body which has an average AlN grain size of 5 μm or less, a thermal conductivity of 50 to 250 W/m.K, a relative density of 98% or more, and an absolute oxygen content of 0.05 to 5 wt % and which contains fluorine, and a conductor layer formed on the insulating layer, consisting primarily of W or Mo, and containing fluorine.

According to the above ceramic circuit board, although the range of the average grain size of the AlN sintered body is slightly high, the adhesion properties between the ceramic insulating layer and the conductor layer are excellent since fluorine exists continuously in the two layers. This suppresses defects such as peeling of the conductor layer and ensures a sufficient strength. This circuit board therefore exhibits a high thermal diffusivity (thermal conductivity) and a high heat resistance resulting from the application of AlN as an insulating material. In addition, since defects in the conductor layer such as peeling and disconnection are prevented, the circuit board has a high circuit performance.

In the manufacture of the above ceramic circuit board, it is possible to use an AlN powder with an average primary grain size falling within a slightly wide range of approximately 0.02 to 3.0 μm and an impurity oxygen amount of about 0.1 to 7 wt % in the method mentioned earlier.

If the average primary grain size of the AlN powder is less than 0.02 μm, processing such as formation of sheets becomes difficult to perform, and this may increase the impurity oxygen amount in the final AlN sintered body, making it impossible to obtain a high thermal conductivity. In addition, since the sheet density decreases to increase the shrinkage ratio during sintering, position control for circuits on the sheet surface tends to be difficult to perform. On the other hand, if the average primary grain size of the AlN powder exceeds 3.0 μm, there is a possibility that the sintering properties become too low to densify the AlN sintered body sufficiently. The average primary grain size of the AlN powder is more preferably 0.05 to 1.5 μm.

If the impurity oxygen amount of the AlN powder is less than about 0.1 wt %, the sintering properties may become too low to densify the AlN sintered body satisfactorily. If the impurity oxygen amount of the AlN powder exceeds 7 wt %, there is a possibility that a high thermal conductivity cannot be obtained in the AlN sintered body. The impurity oxygen amount of the AlN power more preferably ranges between 0.3 and 4 wt %.

The amount of the sintering agent mixed together with the AlN powder can be set at about 0.1 to 20 wt % with respect to the total weight of the AlN powder and the sintering agent powder. If the mixing amount of the sintering agent is less than 0.1 wt %, there is a possibility that no high thermal conductivity can be achieved in the AlN sintered body and the sintering properties are degraded. A mixing amount of the sintering agent exceeding 20 wt % may also make it impossible to achieve a high thermal conductivity. The mixing amount of the sintering agent more preferably ranges from 0.2 to 10 wt %.

The present invention will be described in more detail below by way of its examples. However, these examples are described for better understanding of the present invention and do not particularly limit the invention.

EXAMPLE 1

5 wt % of a $YF_3$ powder with an average grain size of 0.2 μm and a purity of 99.9% were added to an AlN powder with an average primary grain size of 0.2 μm and an impurity oxygen amount of 2.3 wt %, and an acrylic binder and an organic solvent were added to the powder mixture. After being mixed and degassed, the resultant material was formed into a sheet 0.8 mm in thickness by a tape casting process. Subsequently, the sheet was cut, and two of them were stacked and hot-pressed to manufacture a molded body with dimensions of 100 mm×100 mm×1.6 mm. The molded body was then heated in the atmosphere at 600° C. to remove the binder. Subsequently, the molded body was degreased and was then sintered in a nitrogen gas atmosphere at 0.8 atm and 1,500° C. for 12 hours, thereby manufacturing an AlN sintered body.

EXAMPLE 2

An AlN sintered body was manufactured following the same procedures as in Example 1 except that an AlN powder with an average primary grain size of 0.05 μm and an impurity oxygen amount of 3.1 wt % was used.

EXAMPLE 3

An AlN sintered body was manufactured following the same procedures as in Example 1 except that an AlN powder with an average primary grain size of 0.08 μm and an impurity oxygen amount of 2.8 wt % was used.

EXAMPLE 4

An AlN sintered body was manufactured following the same procedures as in Example 1 except that an AlN powder with an average primary grain size of 0.3 μm and an impurity oxygen amount of 2.0 wt % was used.

EXAMPLE 5

An AlN sintered body was manufactured following the same procedures as in Example 1 except that an AlN powder with an average primary grain size of 0.03 μm and an impurity oxygen amount of 4.2 wt % was used.

Comparative Example 1

An AlN sintered body was manufactured following the same procedures as in Example 1 except that sintering was performed in a nitrogen gas atmosphere at 1 atm and 1,800° C. for 48 hours.

Measurements of the density, the thermal conductivity, the four-point flexural strength, and the average AlN grain size were performed for each of the AlN sintered bodies according to Examples 1 to 5 and Comparative Example 1. The results are shown in Table 1 presented later. Note that these characteristics were obtained by test methods explained below.
(1) Density of sintered body
The density was measured by an Archimedes method. The relative density was calculated from the density measured and the ratio of constituent phases obtained by x-ray diffraction.
(2) Thermal conductivity
The thermal diffusivity of each sintered body was measured by using a laser flash type thermal conductivity measuring device manufactured by Shinku Riko K.K. The measurement was performed at a room temperature of 21°

C.±2° C. In addition, the specific heat of each sintered by was measured by using a DSC available from Seiko Denshi K.K. The heat conductivity was calculated by multiplying the thermal diffusivity, the specific heat, and the density.

(3) Four-point flexural strength

Each sintered body was cut into samples with dimensions of 40 mm×4 mm×1.2 mm, and the four-point flexural strength of each sample was measured in accordance with JIS1601. Note that in Table 1 below, the four-point flexural strength is represented by an average value of 40 samples of each sintered body.

(4) Average grain size of AlN grains

The average grain size was obtained by an intercept process by observing the break surface of each sintered body by using SEM. That is, a straight line was drawn on an SEM photograph, and the average grain size was calculated by dividing the length of the straight line by the number of AlN grains traversing the line and multiplying the quotient by 3/2. In this case, the measurement was performed by using 50 or more AlN grains traversing the straight line so as to minimize statistical errors.

TABLE 1

|  | Density, g/cm³ | Thermal conductivity, W/m · K | 4-point flexural strength, kg/mm² | Average grain size (μm) of AlN grains of sintered body |
| --- | --- | --- | --- | --- |
| Example 1 | 3.27 | 220 | 45 | 1.5 |
| Example 2 | 3.27 | 160 | 45 | 1.8 |
| Example 3 | 3.27 | 170 | 46 | 1.6 |
| Example 4 | 3.27 | 215 | 48 | 1.3 |
| Example 5 | 3.27 | 110 | 42 | 2.0 |
| Comparative Example 1 | 3.27 | 240 | 27 | 15.2 |

The AlN sintered bodies according to Examples 1 to 5 and Comparative Example 1 were also measured by X-ray diffraction. As a result, the AlN sintered body of Example 1 was found to be contained YOF, $Y_2O_3$ and $Y_3Al_5O_{12}$ in amount of 2.5 wt %, 1.8 wt % and 2.1 wt %, respectively, in addition to AlN. In Example 2, YOF, $Y_2O_3$ and $Y_3Al_5O_{12}$ were found to be contained in amount of 2.7 wt %, 0.8 wt % and 2.6 wt %, respectively, in addition to AlN. In Example 3, YOF, $Y_2O_3$ and $Y_3Al_5O_{12}$ were found to be contained in amount of 2.6 wt %, 1.3 wt % and 2.5 wt %, respectively, in addition to AlN. In Example 4, in Example 4, YOF, $Y_2O_3$ and $Y_3Al_5O_{12}$ were found to be contained in amount of 2.0 wt %, 2.2 wt % and 1.8 wt %, respectively, in addition to AlN. Further, in Example 5, YOF, $Y_2O_3$ and $Y_3Al_5O_{12}$ were found to be contained in amount of 3.2 wt %, 2.2 wt % and 1.8 wt %, respectively, in addition to AlN. On the other hand, when it comes to Comparative Example 1, YOF, $Y_2O_3$ and $Y_3Al_5O_{12}$ were found to be contained in amount of 0 wt %, 0.02 wt % and 0.01 wt % or less, respectively, in addition to AlN.

EXAMPLE 6

5 parts by weight of a $YF_3$ powder with an average grain size of 0.1 μm and a purity of 99.9% were added to 95 parts by weight of an AlN powder with an average primary grain size of 0.08 to 0.2 μm and an impurity oxygen amount of 2.5 wt %, and the powder mixture was milled and mixed by using a ball mill to prepare a material powder. Subsequently, 7 wt % of an acrylic binder were added to the material powder, the mixture was granulated, and the granulated powder was molded into a powder compact at a uniaxial pressure of 500 kg/cm². The resultant powder compact was then heated up to 700° C. in a nitrogen gas atmosphere to remove the acrylic binder. Subsequently, the powder compact was placed in an AlN vessel and sintered in a nitrogen gas atmosphere at 1 atm and 1,500° C. for three hours in a carbon heater oven, manufacturing an AlN sintered body.

The density, the thermal conductivity, the four-point flexural strength, and the average grain size of AlN grains of the AlN sintered body according to Example 6 were measured following the same procedures as in Example 1, and its constituent phases were also measured by X-ray diffraction. The result was that the density was 3.29 g/cm³, the thermal conductivity was 170 W/m.K, the four-point flexural strength was 46 kg/mm², and the average grain size was 1.1 μm. In addition, YOF, $Y_2O_3$, and $Y_3Al_5O_{12}$ were detected in amount of 2.8 wt %, 1.2 wt % and 2.3 wt %, respectively, as the constituent phases other than AlN, and a small amount of an unknown phase was also contained.

Comparative Example 2

3 parts by weight of a $Y_2O_3$ powder with an average grain size of 0.2 μm and a purity of 99.9% were added to 97 parts by weight of an AlN powder with an average primary grain size of 0.4 to 0.7 μm and an impurity oxygen amount of 1.0 wt %, and the powder mixture was milled and mixed by using a ball mill to prepare a material powder. Subsequently, 5 wt % of an acrylic binder were added to the material powder, the mixture was granulated, and the granulated powder was molded into a powder compact at a uniaxial pressure of 500 kg/cm². The resultant powder compact was then heated up to 700° C. in a nitrogen gas atmosphere to remove the acrylic binder. Subsequently, the powder compact was placed in an AlN vessel and sintered in a nitrogen gas atmosphere at 1 atm and 1,800° C. for three hours in a carbon heater oven, manufacturing an AlN sintered body.

The density, the thermal conductivity, the four-point flexural strength, and the average grain size of AlN grains of the AlN sintered body according to Comparative Example 2 were measured following the same procedures as in Example 1, and its constituent phases were also measured by X-ray diffraction. The result was that the density was 3.31 g/cm³, the thermal conductivity was 170 W/m.K, the four-point flexural strength was 32 kg/mm², and the average grain size was 6.5 μm. The constituent phases other than AlN were $Y_3Al_5O_{12}$ and $YAlO_3$.

The AlN sintered body of Comparative Example 2 maintained a high thermal conductivity, but its strength was low because of its large grain size. The reason for this is assumed that the grain size of the AlN powder used was large and sintering was performed at a high temperature, i.e., these conditions were unpreferable.

Comparative Example 3

An AlN sintered body was manufactured following the same procedures as in Comparative Example 2 except that the sintering step was performed in a nitrogen gas atmosphere at 1 atm and 1,450° C. for three hours.

The density, the thermal conductivity, the four-point flexural strength, and the average diameter of AlN grains of the AlN sintered body manufactured were measured following the same procedures as in Example 1, and its constituent phases were also measured by X-ray diffraction. As a result, the density was 2.1 g/cm³, i.e., the sintered body was not densified sufficiently, and the thermal conductivity was very low, 15 W/m.K. The four-point flexural strength was 5.1 kg/mm², and the average grain size was 0.6 μm. The constituent phases other than AlN were $Y_3Al_5O_{12}$ and $Y_2O_3$.

The AlN sintered body according to Comparative Example 3 was poor in both the thermal conductivity and the strength. The reason for this is estimated that the grain size of the AlN powder used and the sintering conditions were inadequate.

EXAMPLE 7

6 parts by weight of a $YF_3$ powder with an average grain size of 0.3 μm and a purity of 99.9% were added to 94 parts by weight of an AlN powder with an average primary grain size of 0.03 to 0.1 μm and an impurity oxygen amount of 2.6 wt %. The resultant powder mixture was dispersed together with an acrylic binder in an alcoholic solvent, thereby preparing a slip with a viscosity of approximately 5,000 cps. The slip thus prepared was formed into a green sheet with a uniform thickness of about 0.3 mm by a doctor blade process. Subsequently, the green sheet was cut into a desired size, and via holes for electrically connecting individual layers were formed in each green sheet. Thereafter, a tungsten paste containing tungsten grains with an average grain size of 0.8 μm was filled under pressure into the individual via holes. The tungsten paste was then screen-printed on each green sheet in which the via holes were formed, thereby forming a desired tungsten paste pattern to serve as a conductor circuit.

A desired number of green sheets thus manufactured were stacked and integrated by using a hot press. Thereafter, the external shape was processed, and the resultant structure was heated up to 700° C. in a nitrogen atmosphere to remove the acrylic binder. After being degreased, the resultant stacked product was placed in an AlN vessel and subjected to simultaneous sintering in a nitrogen gas atmosphere at 1,450° C. for five hours in a carbon heater oven, thereby manufacturing a ceramic circuit board.

When the circuit board thus obtained was observed by using SEM photographs, both the AlN layers (insulating layers) and the W layers (conductor layers) were densified satisfactorily. The average grain size of the AlN crystal grains was found to be 0.9 μm, and the average grain size of the W crystal grains was found to be 1.2 μm. When a region where the AlN and W layers mixed together was checked by an SEM, the average grain size was 1.4 μm.

EXAMPLE 8

5 parts by weight of a $YF_3$ powder with an average grain size of 0.1 μm and a purity of 99.9%, 1 part by weight of an $Al_2O_3$ powder with an average grain size of 0.2 μm and a purity of 99.9%, and 0.4 parts by weight of a tungsten oxide ($WO_3$) powder with an average grain size of 0.06 μm and a purity of 99.9% were added to 93.6 parts by weight of an AlN powder with an average primary grain size of 0.03 to 0.11 μm and an impurity oxygen amount of 2.2 wt %. The resultant powder mixture was dispersed together with an acrylic binder in an alcoholic solvent, thereby preparing a slip with a viscosity of approximately 5,000 cps. Following the same procedures as in Example 7, a green sheet was manufactured and cut, via holes were formed in each green sheet, a tungsten paste was filled under pressure into the individual via holes, and a desired tungsten paste pattern was formed on each green sheet.

A desired number of green sheets thus manufactured were stacked and integrated by using a hot press. Thereafter, the external shape was processed, and the resultant structure was heated up to 700° C. in a nitrogen atmosphere to remove the acrylic binder. After being degreased, the resultant stacked product was placed in an AlN vessel and subjected to simultaneous sintering in a nitrogen gas atmosphere at 1,400° C. for 24 hours in a carbon heater oven, thereby manufacturing a ceramic circuit board.

When the circuit board thus obtained was observed by using SEM photographs, both the AlN layers and the W layers were densified sufficiently. The average grain size of the AlN crystal grains was found to be 0.9 μm, and the average grain size of the w crystal grains was found to be 1.0 μm. When a region where the AlN and W layers mixed together was checked by an SEM, the average grain size was 1.2 μm.

EXAMPLE 9

3 parts by weight of a $YF_3$ power with an average grain size of 0.1 μm and a purity of 99.9% were added to 100 parts by weight of an AlN powder mixture consisting of 30 parts by weight of an AlN powder with an average primary grain size of 0.03 to 0.09 μm and an impurity oxygen amount of 1.8 wt % and 70 parts by weight of an AlN powder with an average primary grain size of 0.6±0.2 μm and an impurity oxygen amount of 1.0 wt %. The resultant powder mixture was milled and mixed by using a ball mill, preparing a material powder. The material powder was then added to 5 wt % of an acrylic binder, the mixture was granulated, and the resultant granulated powder was molded into a powder compact at a uniaxial pressure of 500 kg/cm². Subsequently, the powder compact was heated up to 700° C. in a nitrogen gas atmosphere to remove the acrylic binder. The density of the powder compact after the binder was removed, i.e., the green density was found to be 1.94 g/cm³. The powder compact was then set in an AlN vessel and sintered in a nitrogen gas atmosphere at 1 atm and 1,500° C. for three hours in a graphite heater oven, thereby manufacturing an AlN sintered body.

The resultant AlN sintered body was white.

The density of this AlN sintered body was measured by the Archimedes method as in Examples 1 to 5. As a result, the density was found to be 3.29 g/cm³, indicating that the sintered body was densified satisfactorily.

The linear shrinkage ratio was calculated from the change in dimensions of the sintered body which took place during the sintering. The calculated linear shrinkage ratio was 16.2%.

A disk 10 mm in diameter and 3 mm in thickness was cut out from the AlN sintered body, and its thermal conductivity was measured at a room temperature of 21° C.±2° C. by the laser flash process following the same procedures as in Examples 1 to 5. Consequently, it was confirmed that the disk had a high thermal conductivity of 170 W/m.K.

A piece of the AlN sintered body was pulverized, and the constituent phases were checked by X-ray diffraction. As a result, YOF, $Y_2O_3$, and $Y_3Al_5O_{12}$ were detected in amount of 1.8 wt %, 0.8 wt % and 1.0 wt %, respectively, as the constituent phases other than AlN, and a small amount of an unknown phase was also contained.

Comparative Example 4

3 parts by weight of a $YF_3$ powder with an average grain size of 0.1 μm and a purity of 99.9% were added to 97 parts by weight of an AlN powder with an average primary grain size of 0.6±0.2 μm and an impurity oxygen amount of 1.0 wt %. Thereafter, the resultant powder mixture was sintered following the same procedures as in Example 9 to manufacture an AlN sintered body. The green density was 1.84 g/cm$^3$.

The density of the resultant AlN sintered body was 2.21 g/cm$^3$, i.e., the sintered body was not densified well, and its thermal conductivity was as low as 51 W/m.K. The reason for this is assumed that the grain size of the AlN powder was large and the sintering conditions were unpreferable.

EXAMPLE 10

An AlN sintered body was manufactured following the same procedures as in Example 9 except that an AlN powder mixture consisting of 60 parts by weight of an AlN powder with an average primary grain size of 0.05 to 0.08 μm and an impurity oxygen amount of 1.8 wt % and 40 parts by weight of an AlN powder with an average primary grain size of 0.6±0.2 μm and an impurity oxygen amount of 1.0 wt % was used. The green density was found to be 1.80 g/cm$^3$.

The density, the linear shrinkage ratio, and the thermal conductivity of the obtained AlN sintered body were evaluated following the same procedures as in Example 9. Consequently, the density was 3.29 g/cm$^3$, the linear shrinkage ratio was 18.5%, and the thermal conductivity was 155 W/m.K.

EXAMPLE 11

5 parts by weight of a YF$_3$ powder with an average grain size of 0.1 μm and a purity of 99.9% were added to 100 parts by weight of an AlN powder mixture consisting of 30 parts by weight of an AlN powder mixture with an average primary grain size of 0.01 to 0.06 μm and an impurity oxygen amount of 2.1 wt % and 70 parts by weight of an AlN powder with an average primary grain size of 0.7 to 0.9 μm and an impurity oxygen amount of 0.95 wt %. The resultant powder mixture was milled and mixed by using a ball mill, thereby preparing a material powder. The material powder was then added with 10 wt % of an acrylic binder, the mixture was granulated, and the granulated powder was molded into a powder compact at a uniaxial pressure of 500 kg/cm$^2$. Subsequently, the powder compact was heated up to 700° C. in a nitrogen gas atmosphere to remove the acrylic binder. After the removal of the binder, the green density was 1.90 g/cm$^3$. The powder compact was then set in an AlN vessel and sintered in a nitrogen gas atmosphere at 1 atm and 1,400° C. for 18 hours in a graphite heater oven, manufacturing an AlN sintered body.

The density, the linear shrinkage ratio, and the thermal conductivity of the resultant AlN sintered body were evaluated following the same procedures as in Example 9. The result was that the density was 3.30 g/cm$^3$, the linear shrinkage ratio was 18.6%, and the thermal conductivity was 160 W/m.K.

EXAMPLE 12

A powder compact having the same composition as in Example 11 and subjected to binder removal was set in a graphite vessel and sintered in a nitrogen gas atmosphere at 1 atm and 1,450° C. for 96 hours in a graphite heater oven, thereby manufacturing an AlN sintered body.

The density, the linear shrinkage ratio, and the thermal conductivity of the resultant AlN sintered body were evaluated following the same procedures as in Example 9. The result was that the density was 3.26 g/cm$^3$, the linear shrinkage ratio was 18.9%, and the thermal conductivity was 255 W/m.K. When constituent phases were evaluated by X-ray diffraction, no phases except AlN were detected.

EXAMPLE 13

An AlN sintered body was manufactured following the same procedures as in Example 9 except that an AlN powder mixture consisting of 10 parts by weight of an AlN powder with an average primary grain size of 0.01 to 0.06 μm and an impurity oxygen amount of 2.1 wt % and 90 parts by weight of an AlN powder with an average primary grain size of 0.6±0.2 μm and an impurity oxygen amount of 1.0 wt % was used. The green density was found to be 1.88 g/cm$^3$.

The density, the linear shrinkage ratio, and the thermal conductivity of the resultant AlN sintered body were evaluated following the same procedures as in Example 9. Consequently, the density was 3.29 g/cm$^3$, the linear shrinkage ratio was 18.5%, and the thermal conductivity was 175 W/m.K.

EXAMPLE 14

3 wt % of a YF$_3$ powder with an average grain size of 0.2 μm and a purity of 99.9% were added to an AlN powder with an average primary grain size of 0.6 μm and an impurity oxygen amount of 1.0 wt %, and a polymer binder and an organic solvent were added to the resultant powder mixture. After being mixed and degassed, the resultant material was molded into a sheet 0.8 mm thick by a tape casting process. After the sheet was cut, two of them were stacked and hot-pressed to form a molded body with dimensions of 100 mm×100 mm×1.6 mm. Subsequently, the molded body was heated in the atmosphere at 600° C. to remove the binder. The molded body was degreased and was then sintered in a nitrogen gas atmosphere at 0.8 atm and 1,500° C. for 12 hours, thereby manufacturing an AlN sintered body.

The density of the obtained AlN sintered body was measured by an Archimedes method. As a result, the density was found to be 3.28 g/cm$^3$, demonstrating that the sintered body was densified well.

In addition, following the same procedures as in Examples 1 to 5, the thermal conductivity, the four-point flexural strength, and the average grain size of the AlN grains of the above AlN sintered body were evaluated. Consequently, it was confirmed that the thermal conductivity was 220 W/m.K, the four-point flexural strength was 45 kg/mm$^2$ (Weibull coefficient 21), and the average grain size of the AlN grains was 1.5 μm.

Comparative Example 5

An AlN sintered body was manufactured following the same procedures as in Example 14 except that in place of the YF$_3$ powder, 3 wt % of a Y$_2$O$_3$ powder (2.38 wt % as an amount of Y) with a purity of 99.9% were added to an AlN powder.

The density of the resultant AlN sintered body was 2.14 g/cm$^3$, i.e., the sintered body was not densified satisfactorily. The thermal conductivity was found to be 20 W/m.K, and the four-point flexural strength was 5 kg/mm$^2$. The reason for this is estimated that the grain size of the AlN powder used was large, and the type of the sintering agent and the sintering conditions were inadequate.

Comparative Example 6

An AlN sintered body was manufactured following the same procedures as in Example 14 except that in place of the YF$_3$ powder, 3 wt % of a Y$_2$O$_3$ powder (2.38 wt % as an amount of Y) with a purity of 99.9% were added to an AlN powder, and that sintering was performed in a nitrogen gas atmosphere at 1 atm and 1,800° C. for 48 hours.

The density of the resultant AlN sintered body was found to be 3.27 g/cm$^3$, i.e., the sintered body was not densified sufficiently. The thermal conductivity was 240 W/m.K, and the four-point flexural strength was 27 kg/mm$^2$.

Although the AlN sintered body of Comparative Example 6 maintained a high thermal conductivity, its density and strength were low. The reason for this is estimated that the grain size of the AlN powder was slightly large and high-temperature sintering was performed, i.e., these conditions were unpreferable.

EXAMPLE 15

In Example 15, a ceramic circuit board with a multilayered wiring structure using a low-melting metal, such as Pd, as a conductor metal, and AlN as an insulating material was manufactured.

5 wt % of a YF$_3$ powder, as a sintering agent, were added to an AlN powder with an average primary grain size of 0.08 μm, and the resultant powder mixture was wet-mixed in n-butanol for about 48 hours by using a ball mill. This powder mixture was dispersed together with an organic binder, such as a polycaprolactone-based or polyacrylate-based resin, which is readily decomposed in a neutral atmosphere, into an alcoholic solvent, thereby preparing a slurry with a viscosity of approximately 3,000 to 7,000 cps.

The slurry was then coated on an organic film according to a casting film formation process, forming a plurality of green sheets with even thicknesses of 10 to 200 μm. Subsequently, a plurality of via holes for connecting layers were formed at predetermined positions of the green sheets by using a punch and a die.

A conductor paste prepared by adding a binder and a solvent to a low-resistance powder of Pd and kneading the resultant material was printed on one surface of each green sheet and filled into the via holes so as to form a predetermined pattern by using a screen printing process, thereby forming a conductor layer. Subsequently, a plurality of green sheets on each of which a conductor layer as described above was formed were stacked such that the positions of the via holes were aligned appropriately, and were subjected to hot-pressing. Thereafter, the end portions of the resultant stacked body were cut to obtain a predetermined shape.

The stacked body thus obtained was subjected to degreasing (binder removal) at a temperature of about 400° to 600° C. and sintered in a nitrogen atmosphere at 1,500° C. for six hours, manufacturing a ceramic circuit board with a multilayered wiring structure in which the individual conductor layers were connected through the via holes.

FIG. 1 is a view showing the sectional structure of the ceramic circuit board with a multilayered wiring structure manufactured by the above method. A multi-layered ceramic circuit board 1 is formed by stacking a plurality of ceramic insulating layers 11 consisting primarily of an AlN polycrystalline body. Conductor layers 12 containing Pd as the main constituent and having respective predetermined patterns constituted by signal lines, power sources, and the like are formed on the surfaces of the ceramic insulating layers 11. Via holes 13 are also formed at predetermined positions of the ceramic insulating layers 11. The conductor layers 12 formed on the surfaces of the ceramic insulating layers 11 are electrically connected through a conductor metal filled inside the via holes 13. Die pads 14 and bonding pads 15 for mounting LSI chips (not shown) are formed on the surface of the uppermost one of the ceramic insulating layers 11. In addition, I/O pads 16 for input/output of signals are formed on the lower surface of the lowermost one of the ceramic insulating layers 11 at positions corresponding to the via holes.

various characteristics of the multilayered ceramic circuit board 1 with the above structure were evaluated. The result was that the specific resistance was $10^{11}$ Ω.cm or more, the dielectric constant was 8.7 (1 MHz), and the dielectric loss was $1 \times 10^{-3}$ or less (1 MHz). The multilayered ceramic circuit board 1 also exhibited electrical characteristics equivalent to those of a conventional ceramic circuit board having insulating layers, which are manufactured by sintering a material powder consisting of an AlN powder and a Y$_2$O$_3$ powder, and conductor layers consisting of W. In addition, the ceramic insulating layers 11 consisting of AlN sintered body were densified sufficiently, and no pores were found. The average primary grain size of the AlN grains was measured by an intercept process and found to be 1.5 μm.

In this multilayered ceramic circuit board 1, heat generated by LSI chips mounted on the die pads 14 when the LSI chips are driven is diffused efficiently to the ceramic insulating layers 11 through the die pads 14. Consequently, the heat generated by the LSI chips can be radiated well through the circuit board.

In the above multilayered ceramic circuit board 1, the ceramic insulating layers 11 had good adhesion properties with respect to the conductor layers 12 and the conductor metal filled in the via holes 13, and this suppressed occurrence of cracks. In addition, since no oxide-based sintering agent such as Y$_2$O$_3$ was used, excessive oxidation of the conductor layers 12 and the like was prevented.

EXAMPLE 16

In Example 16, a ceramic circuit board was manufactured by using a conductor paste added with an AlN powder containing a YF$_3$ powder.

Approximately 25 vol % of an AlN powder containing 3 wt % of YF$_3$ were added to a powder of Pd. 100 parts by weight of this powder mixture were added with 3 parts by weight of ethylcellulose, as an organic binder, and 15 parts by weight of butylcarbitol and 100 parts by weight of methylethylketone, as a solvent. The resultant material was kneaded by using a ball mill, a stirrer, and a three-roll mill, thereby preparing a conductor paste.

The conductor paste was then printed into a predetermined pattern by a screen printing process on an AlN green sheet about 500 μm in thickness formed following the same procedures as in Example 15, thereby forming a conductor layer. Subsequently, the resultant structure was degreased by heating in an N$_2$ flow at about 600° C. and was sintered in an N$_2$ flow at about 1,400° C. for six hours, manufacturing a ceramic circuit board.

The conductor layer constituting the ceramic circuit board thus manufactured was subjected to powder X-ray analysis. As a result, an Al-Pd alloy and a Y-Pd alloy were formed in the sintered conductor layer, but the electrical resistance did not particularly increase. No oxide of Pd was found.

As described above, the ceramic circuit board of Example 16 had a high circuit performance with a low electrical resistance.

EXAMPLE 17

In Example 17, the characteristics of a conductor layer and an insulating layer of a ceramic circuit board manufactured by using W as a conductor metal and AlN as an insulating material were evaluated.

10 vol %, 35 vol %, and 60 vol % of a powder mixture consisting of 3 wt % of a $YF_3$ powder with an average grain size of 1.2 μm and 97 wt % of an AlN powder with an average grain size of 0.6 μm and an impurity oxygen amount of 1.0 wt % were added to a W powder with an average grain size of 0.7 μm, respectively, and the individual resultant powder mixtures were mixed and milled sufficiently by using a ball mill. Separately, a powder mixture consisting of only an AlN powder and a $YF_3$ powder was mixed and milled in the same manner as described above.

5 parts by weight of paraffin as a binder were added to 100 parts by weight of each of the above powder mixtures having four different compositions, and each resultant material was uniaxially pressed at a pressure of 500 kg/cm$^2$ to form a powder compact with dimensions of 30 mm×30 mm×10 mm. Subsequently, the binder was removed from these powder compacts, and each resultant powder compact was placed in an $N_2$ atmosphere in a carbon heater oven and sintered by heating up to 1,300° C., 1,400° C., 1,500° C., and 1,600° C. at a rate of 500° C./hour. Each of the powder compact was oven-cooled with a 0-minute hold time and a six-hour hold time, thereby forming twenty type sintered bodies. Note that the sintered body formed by using the W powder corresponds to a conductor layer of a circuit board, and the sintered body formed by using the powder mixture consisting only of the AlN powder and the $YF_3$ powder corresponds to an insulating layer of a circuit board.

Figure 2:
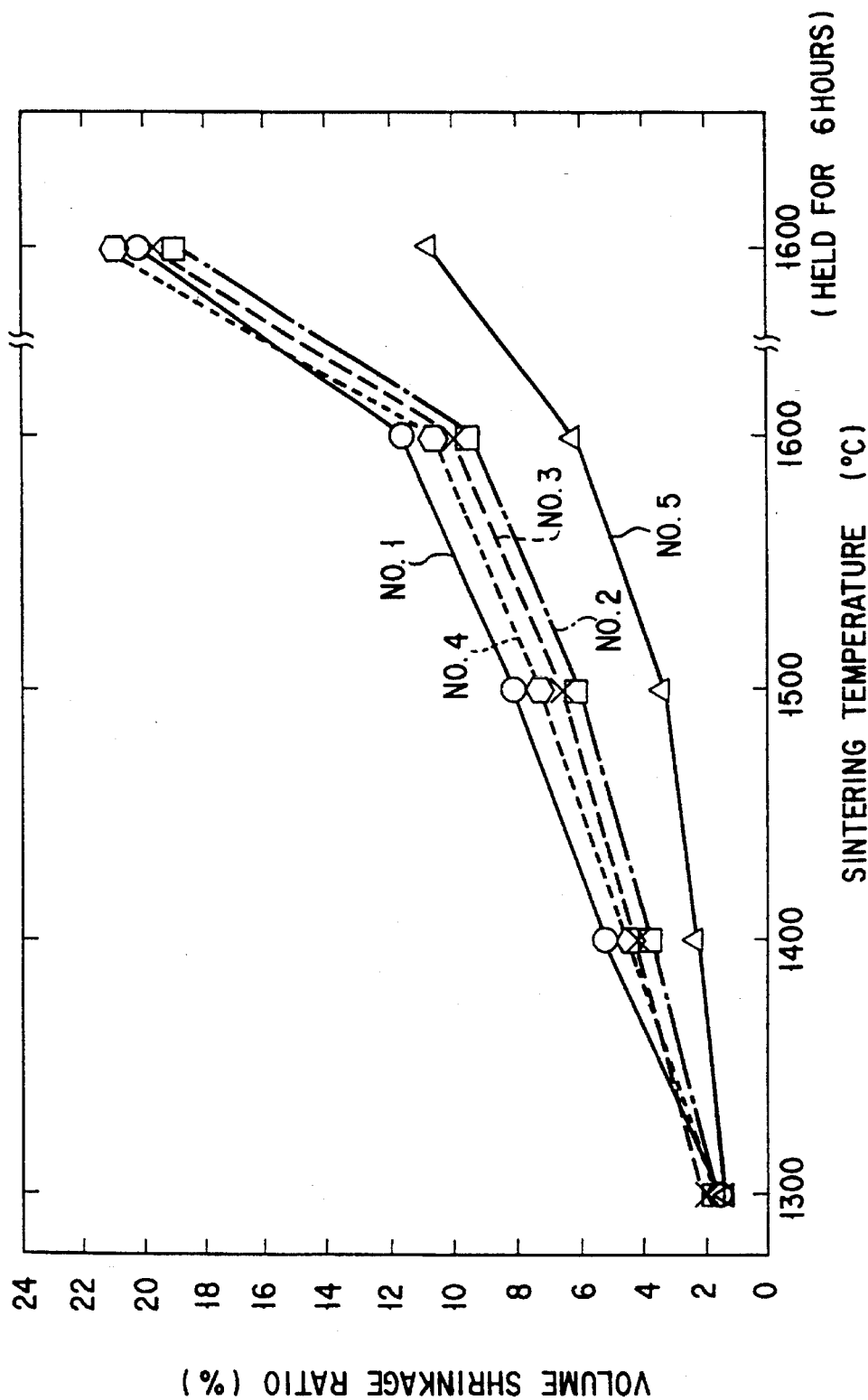
FIG. 2 is a graph showing the relationship between the shrinkage ratio of a sintered body, which is applied to the ceramic circuit board of the embodiment according to the present invention, and the sintering temperature.

The shrinkage ratios of the resultant AlN sintered bodies were measured. FIG. 2 shows the relationship between the shrinkage ratio and the sintering temperature. In FIG. 2, a sintered body (an insulating layer) of sample No. 1 consists of 97 wt % of AlN powder and 3 wt % of $YF_3$. A sintered body (a conductor layer) of sample No. 2 consists of 90 vol % of a W powder and 10 vol % of a powder mixture. A sintered body (a conductor layer) of sample No. 3 consists of 65 vol % of the W powder and 35 vol % of the powder mixture. A sintered body (a conductor layer) of sample No. 4 consists of 40 vol % of the W powder and 10 vol % of the powder mixture. Note that the powder mixture consists of 97 wt % of AlN powder and 3 wt % of $YF_3$. In addition, in accordance with the same procedure as in Example 17, a sintered body was formed by milling, molding and sintering a W powder along with an average grains size of 0.7 μm, and the shrinkage ratio of the sintered body was measured. The relationship between the shrinkage ratio and the sintering temperature is also shown in FIG. 2 as sample No. 5.

Figure 3:
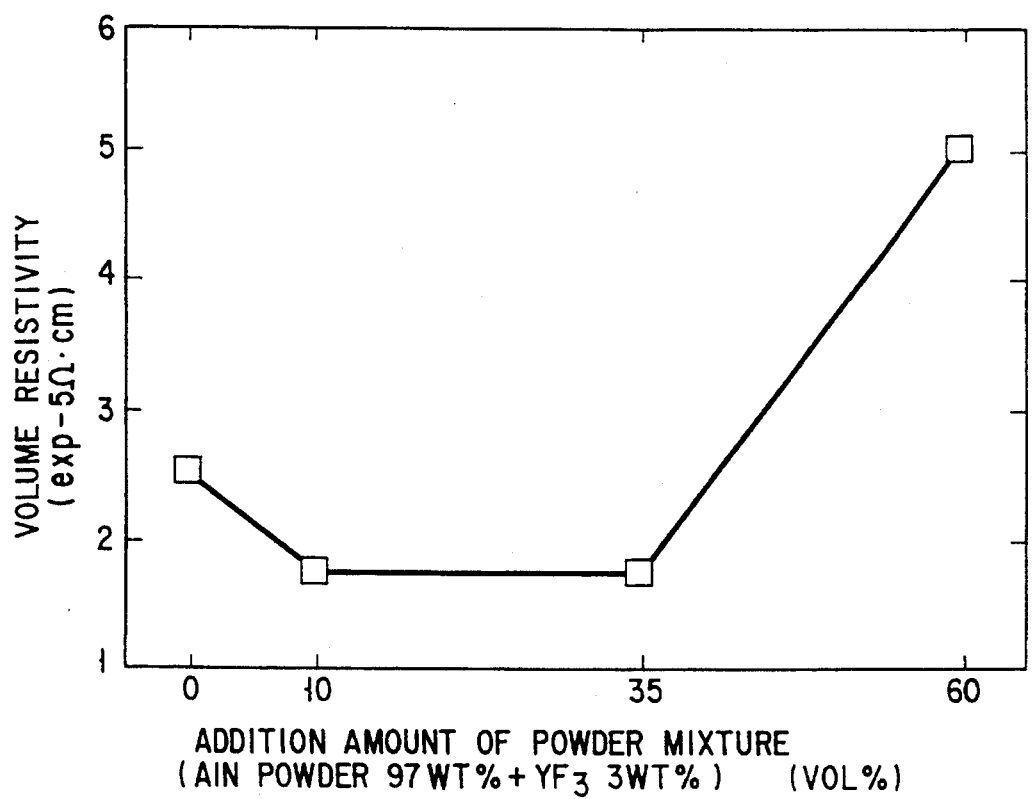
FIG. 3 is a graph showing the relationship between the volume resistivity of a sintered body, which is applied to the ceramic circuit board of the embodiment according to the present invention, and the addition amount of a powder mixture of an AlN powder and a $YF_3$ powder in the manufacture of the sintered body.

The volume resistivity was also measured for each sintered body obtained by a hold time of six hours after heating up to 1,600° C. FIG. 3 shows the relationship between the volume resistivity and the addition amount of the powder mixture of the AlN powder and the $YF_3$ powder.

The results shown in FIG. 2 reveal that in a sintering temperature range between 1,300° and 1,600° C., each conductor layer (Nos. 2 to 4) formed by using the W powder and the powder mixture consisting of the AlN powder and the $YF_3$ powder presented a shrinkage ratio closer to that of the AlN sintered body formed (No. 1) by using only the powder mixture consisting of the AlN powder and the $YF_3$ powder than the conductor layer (No. 5) formed by using only the W powder. This demonstrates that in the manufacture of a circuit board, if a conductor layer is formed by using a powder mixture of W and $YF_3$ and an insulating layer is formed by using a powder mixture of AlN and $YF_3$, the shrinkage ratios of the two layers can be matched.

EXAMPLE 18

Powder mixtures were prepared by mixing conductor components and additive components in accordance with the formulation shown in Table 2 below. The resultant powder mixtures were milled, molded, and sintered following the same procedures as in Example 17 and in accordance with the conditions shown in Table 2, thereby forming sintered bodies a to k corresponding to a conductor layer of a circuit board.

The shrinkage ratio and the volume resistivity of each resultant sintered body were measured. The measurement results are also shown in Table 2.

TABLE 2

| | Powder mixture | | | Sintering conditions | | | |
|---|---|---|---|---|---|---|---|
| Sintered body No. | Conductor component.composition (average grain size) | Additive component. composition (average grain size) | Addition amount (vol %) | Temperature (°C.) | Hold time (h) | Shrinkage ratio (%) | Volume resistivity × $10^{-5}$ Ω · cm |
| a | W (0.4 μm) | AlN (0.6 μm) 97 wt % + $YF_3$ 3 wt % | 35 | 1550 | 6 | 21.5 | 1.7 |
| b | W (0.4 μm) | $YF_3$ | 2 | 1600 | 6 | 20.3 | 2.0 |
| c | W (0.4 μm) 65 Wt % W (0.9 μm) 20 wt % W (1.8 μm) 15 wt % | AlN (0.6 μm) 95 wt % + $YF_3$ 5 wt % | 35 | 1550 | 6 | 20.9 | 1.8 |
| d | W (0.9 μm) | AlN (0.1 μm) 95 wt % + $YF_3$ 5 wt % | 15 | 1500 | 24 | 20.7 | 2.0 |
| e | W (0.7 μm) | AlN (0.3 μm) 95 wt % + $S_1$ 5 wt % | 35 | 1550 | 12 | 20.5 | 2.1 |
| f | W (0.7 μm) | AlN (0.3 μm) 97 wt % + $LaF_3$ 3 wt % | 35 | 1600 | 12 | 20.1 | 2.2 |
| g | W (0.7 μm) | AlN (0.3 μm) 99 wt % + $CaF_2$ 1 wt % | 50 | 1600 | 12 | 20.0 | 4.5 |
| h | Mo (2.0 μm) | AlN (0.9 μm) 95 wt % + $YF_3$ 5 wt % | 35 | 1540 | 24 | 20.3 | 2.2 |
| i | Mo (3.0 μm) | AlN (0.9 μm) 95 wt % + $YF_3$ 5 wt % | 35 | 1540 | 24 | 20.1 | 2.3 |
| j | W (0.7 μm) | AlN (0.6 μm) 97 wt % + $S_2$ 3 wt % | 35 | 1550 | 12 | 21.5 | 1.9 |
| k | W (0.7 μm) | AlN (0.6 μm) 97 wt % + $S_3$ 3 wt % | 35 | 1550 | 12 | 20.7 | 2.0 |

S1 ... $YF_3$:$CaF_3$ = 2:1.
S$_2$ ... $YF_3$:$Y_2O_3$ = 2:1.
S$_3$ ... $YF_3$:YOF = 5:1 (wt %).

As can been seen from Table 2, the conductor layers formed by adding $YF_3$ to a conductor metal such as W or Mo stably exhibited substantially constant shrinkage ratios and very low volume resistivities even when the compositions and the sintering conditions varied.

EXAMPLE 19

In Example 19, a ceramic circuit board with a multilayered wiring structure was manufactured by using W as a conductor metal and AlN as an insulating material.

3 wt % of a $YF_3$ powder as a sintering agent were added to 97 wt % of an AlN powder with an average primary grain size of 0.6 μm and an impurity oxygen amount of 1.3 wt %, and the resultant powder mixture was wet-mixed in n-butanol by using a ball mill. This powder mixture was dispersed together with an organic binder in an organic solvent, and the resultant slurry was sheeted in accordance with a doctor blade process, thereby forming a plurality of green sheets. Subsequently, a plurality of via holes for connecting layers were formed at predetermined positions of the green sheets.

Separately, 80.0 vol % of a w powder with an average grain size of 0.7 μm and 20.0 vol % of a powder mixture consisting of 97 wt % of an AlN powder with an average grain size of 0.6 μm and 3 wt % of a $YF_3$ powder were dispersed together with an organic binder in an organic solvent, preparing a conductor paste.

The resultant conductor paste was filled in the via holes of the green sheets and screen-printed on one surface of each sheet, thereby forming conductor layers. A plurality of green sheets on which such conductor layers were formed were stacked such that the positions of the via holes were aligned properly, and were hot-pressed. Subsequently, the resultant stacked structure was sintered in a non-oxidizing atmosphere of, e.g., $N_2$, at 1,540° C. for six hours. In this manner, the conductor layers were electrically connected through the via holes, yielding a ceramic circuit board with a multilayered wiring structure.

In the ceramic circuit board thus manufactured, the insulating layers were densified well, and no pores were found. An upper/lower surface parallelism representing the presence/absence of warpage of the circuit board was obtained by measuring maximum values of warpage in the central portion and the peripheral portion on the surface of the circuit board on the basis of a diagonal on the surface. As a result, the parallelism was found to be 0.1 (mm/diagonal), i.e., exhibited a high level. In addition, the positional precisions at several different portions of the circuit board fell within a range of 0.2%, i.e., presented good values as well.

Comparative Example 7

A ceramic circuit board with a multilayered wiring structure was manufactured in accordance with the same manipulations and the same conditions as in Example 19 except that the powder mixture consisting of the AlN powder and the $YF_3$ powder was not added to a conductor paste.

Following the same procedures as in Example 19, an upper/lower surface parallelism representing the presence/absence of warpage of a board was obtained for the ceramic circuit board manufactured. As a result, the parallelism was 1.4 (m/diagonal), indicating occurrence of a large warpage. In addition, the positional precisions at several different portions of the circuit board were found to be 2.1%, demonstrating that large positional differences took place due to deformation of the circuit board.

It is apparent from the comparison between Example 19 and Comparative Example 7 that the shrinkage ratios of the AlN insulating layer and the conductor layer during sintering match very well by the use of the powder mixture consisting of the AlN powder and the $YF_3$ powder in the formation of the conductor layer.

As has been described above, according to the present invention, there are provided an aluminum nitride (AlN) sintered body with a high thermal conductivity and a high strength, and a method capable of manufacturing the AlN sintered with these characteristics through low-temperature, short-time sintering.

According to the present invention, there is also provided a ceramic circuit board which uses the AlN sintered body as an insulating layer, which has a high thermal conductivity and a high strength, and which can be manufactured by simultaneous sintering at a low temperature for a short time period.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing an aluminum nitride sintered body, comprising the steps of:

adding a halogen-containing rare earth element compound, as a sintering agent, to an aluminum nitride powder with an average primary grain size of 0.05 to 0.3 μm and an impurity oxygen amount of 0.1 to 2.5 wt %;

molding the resultant material to form a molded body; and sintering said molded body in a non-oxidizing atmosphere at 1,000° to 1,600° C. to produce said aluminum nitride sintered body having an average grain size of aluminum nitride grains of not more than 2 μm.

2. The method according to claim 1, wherein said aluminum nitride powder contains 0.3 to 2.0 wt % of impurity oxygen.

3. The method according to claim 1, wherein said halogen-containing rare earth element compound is $YF_3$.

4. The method according to claim 1, wherein said halogen-containing rare earth element compound is YOF.

5. The method according to claim 1, wherein the sintering temperature is 1,300° to 1,600° C.

6. The method according to claim 1, wherein the sintering temperature is 1,300° to 1,550° C.

7. The method according to claim 1, wherein a gas phase pressure in the sintering step is 0.01 atm to a value less than 1 atm.

8. The method according to claim 1, wherein said halogen-containing rare earth element compound is added to said aluminum nitride powder to meet the relationship A/(A+B) less than 0.3, wherein A is the weight of the halogen-containing rare element compound, and B is the weight of the aluminum nitride powder.

9. The method of claim 1, wherein said aluminum nitride powder has an average primary grain size of 0.05 to 0.15 μm.

10. The method of claim 1, further comprising the step of adding at least one member selected from the group consisting of aluminum oxide, aluminum fluoride, silicon oxide and silicon nitride.

11. The method of claim 1, wherein said aluminum nitride powder has an impurity oxygen amount of less than 2.0 wt. %.

12. The method of claim 1, wherein said aluminum nitride powder has an impurity oxygen amount of 1.0 to 1.8 wt. %.

* * * * *